United States Patent
Woo et al.

(10) Patent No.: US 11,737,334 B2
(45) Date of Patent: Aug. 22, 2023

(54) DISPLAY PANEL

(71) Applicant: Samsung Display Co., LTD., Yongin-si (KR)

(72) Inventors: Junhyuk Woo, Yongin-si (KR); Beohmrock Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 237 days.

(21) Appl. No.: 17/119,404

(22) Filed: Dec. 11, 2020

(65) Prior Publication Data
US 2021/0183955 A1   Jun. 17, 2021

(30) Foreign Application Priority Data
Dec. 17, 2019   (KR) .................. 10-2019-0168966

(51) Int. Cl.
| | |
|---|---|
| *H10K 59/38* | (2023.01) |
| *H10K 50/813* | (2023.01) |
| *H10K 50/822* | (2023.01) |
| *H10K 50/844* | (2023.01) |
| *H10K 59/122* | (2023.01) |

(52) U.S. Cl.
CPC ........... *H10K 59/38* (2023.02); *H10K 50/813* (2023.02); *H10K 50/822* (2023.02); *H10K 50/844* (2023.02); *H10K 59/122* (2023.02)

(58) Field of Classification Search
CPC .............. H01L 27/322; H01L 27/3246; H01L 51/5209; H01L 51/5225; H01L 51/5253; H01L 51/5284; H01L 51/5281; H01L 27/3248; H01L 27/3258; H01L 27/3262; H01L 51/5203; H01L 27/3244; H01L 51/56
See application file for complete search history.

(56) References Cited

U.S. PATENT DOCUMENTS

| | | | |
|---|---|---|---|
| 7,643,114 B2 | 1/2010 | Lee et al. | |
| 9,818,970 B2 | 11/2017 | Wu | |
| 9,911,941 B2 | 3/2018 | Choi et al. | |
| 10,185,066 B2 | 1/2019 | Chae et al. | |
| 2016/0322429 A1* | 11/2016 | Chen | ..................... G06F 3/0445 |
| 2017/0125740 A1 | 5/2017 | Lee et al. | |
| 2018/0188866 A1* | 7/2018 | Heo | ..................... H01L 51/5253 |
| 2019/0296088 A1* | 9/2019 | Kim | ..................... H01L 27/322 |

(Continued)

FOREIGN PATENT DOCUMENTS

| | | |
|---|---|---|
| KR | 10-1223727 | 1/2013 |
| KR | 10-1264679 | 5/2013 |

(Continued)

*Primary Examiner* — Kevin Quarterman
(74) *Attorney, Agent, or Firm* — Kile Park Reed & Houtteman PLLC

(57) ABSTRACT

A display device includes a base layer, a first electrode on the base layer, a pixel defining layer on the base layer, the pixel defining layer including a display opening exposing the first electrode, a light emitting pattern on the first electrode, a second electrode on the light emitting pattern, a division pattern on the second electrode, the division pattern including a division opening overlapping the display opening, and a color filter in the division opening. The second electrode includes an electrode opening which overlaps the division opening and is spaced apart from the display opening.

24 Claims, 15 Drawing Sheets

(56) References Cited

U.S. PATENT DOCUMENTS

2019/0371865 A1* 12/2019 Lee .................... H01L 27/3246
2020/0073169 A1*  3/2020 Jung ................. G02F 1/134309
2020/0136074 A1*  4/2020 Lee ...................... H01L 27/322

FOREIGN PATENT DOCUMENTS

| KR | 10-2016-0130042 | 11/2016 |
| KR | 10-2017-0051764 |  5/2017 |
| KR | 10-2018-0018945 |  2/2018 |

* cited by examiner

DISPLAY PANEL

CROSS-REFERENCE TO RELATED APPLICATIONS

This application claims priority to and benefits of Korean Patent Application No. 10-2019-0168966 under 35 U.S.C. § 119, filed on Dec. 17, 2019 in the Korean Intellectual Property Office, the entire contents of which are incorporated herein by reference.

BACKGROUND

1. Technical Field

The disclosure herein relates to a display, and, to a display panel having improved reliability and a manufacturing method thereof.

2. Description of the Related Art

Various display devices used in multimedia devices such as televisions, mobile phones, tablet computers, navigation units, and game consoles have been developed. When external light is incident onto the display device during use, the incident external light is reflected by an electrode or the like in the display panel and may degrade the display quality of the display device.

Thus, there is a demand for research for improving the display quality of the display device by reducing a reflectance caused by external light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device reducing an external light reflectance.

An embodiment provides a display device that may include: a base layer; a first electrode disposed on the base layer; a pixel defining layer disposed on the base layer, the pixel defining layer including a display opening that exposes the first electrode; a light emitting pattern disposed on the first electrode; a second electrode disposed on the light emitting pattern, the second electrode including an electrode opening; a division pattern disposed on the second electrode, the division patterns including a division opening overlapping the display opening; and a color filter disposed in the division opening. The electrode opening may overlap the division opening and may be spaced apart from the display opening.

In an embodiment, the second electrode may include a first portion overlapping the light emitting pattern, a second portion overlapping the division pattern, and a third portion extending from the first portion to the second portion.

In an embodiment, the first portion may have an area greater than an area of the third portion.

In an embodiment, the third portion may be disposed in plurality in an area overlapping the division opening.

In an embodiment, the electrode opening may be disposed in plurality in an area overlapping the division opening.

In an embodiment, the display device may further include at least one of a hole transporting region disposed between the first electrode and the light emitting pattern and an electron transporting region disposed between the light emitting pattern and the second electrode.

In an embodiment, the electrode opening of the second electrode may expose a portion of one of the hole transporting region, the electron transporting region, and the pixel defining layer in an area overlapping the division opening.

In an embodiment, the division opening may have an area greater than an area of the display opening.

In an embodiment, the pixel defining layer may have be a black pixel defining layer.

In an embodiment, the display device may further include an encapsulation member disposed between the pixel defining layer and the color filter and overlapping the second electrode.

In an embodiment, the display device may further include a detection sensor disposed between the encapsulation member and the color filter.

In an embodiment, the color filter may include at least one of a red pigment or dye, a green pigment or dye, or a polymer photosensitive resin.

In an embodiment, the light emitting pattern may be disposed in plurality, and the plurality of light emitting patterns may have different areas from each other.

In an embodiment, a display device may include: a base layer; a first electrode disposed on the base layer; a pixel defining layer disposed on the base layer, the pixel defining layer including a display opening that exposes the first electrode; a light emitting pattern disposed on the first electrode; a second electrode disposed on the light emitting pattern; a division pattern disposed on the second electrode, the division pattern including a division opening overlapping the display opening; and a color filter disposed in the division opening. The second electrode may include a first portion overlapping the light emitting pattern, a second portion overlapping the division pattern, and a third portion extending from the first portion to the second portion.

In an embodiment, an electrode opening, which overlaps the division opening and spaced apart from the display opening, may be defined in the second electrode.

In an embodiment, the third portion may be disposed in plurality in an area overlapping the division opening.

In an embodiment, the second electrode may include a plurality of electrode openings.

In an embodiment, the first portion may have an area greater than an area of the third portion.

In an embodiment, the third portion may be disposed in plurality in an area overlapping the division opening.

In an embodiment, the display device may further include at least one of a hole transporting region disposed between the first electrode and the light emitting pattern and an electron transporting region disposed between the light emitting pattern and the second electrode.

In an embodiment, the electrode opening of the second electrode may expose a portion of one of the hole transporting region, the electron transporting region, and the pixel defining layer in an area overlapping the division opening.

In an embodiment, the division opening may have an area greater than an area of the display opening.

In an embodiment, the pixel defining layer may be a black pixel defining layer.

In an embodiment, the color filter may include at least one of a red pigment or dye, a green pigment or dye, or a polymer photosensitive resin.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1A:
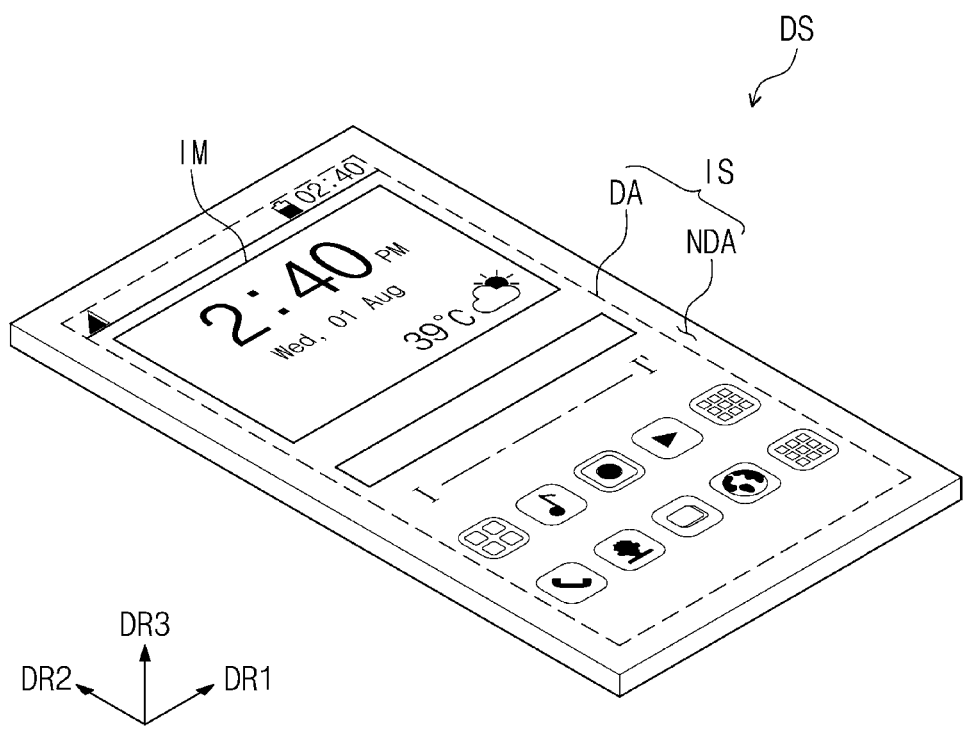
FIG. 1A is a perspective view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms such as 'first' and 'second' are used herein to describe various elements, these elements should not be limited by these terms. It will be understood that although the terms such as 'first' and 'second' are used herein to describe various elements, these elements should not be limited by these terms. For example, a first element referred to as a first element in one embodiment may be referred to as a second element in another embodiment without departing from the scope of the appended claims.

As used herein, the singular forms "a," "an," and "the" are intended to include the plural forms as well, unless the context clearly indicates otherwise.

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Further, in the specification, the phrase "in a plan view" means when an object portion is viewed from above, and the phrase "in a schematic cross-sectional view" means when a schematic cross-section taken by vertically cutting an object portion is viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 1B:
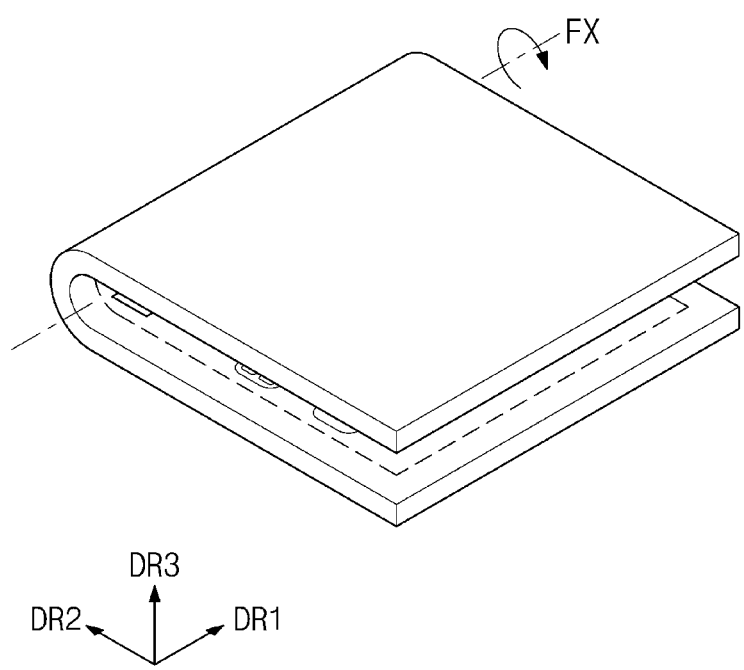
FIG. 1B is a perspective view illustrating a state in which the display device is folded according to an embodiment.
Figure 2:
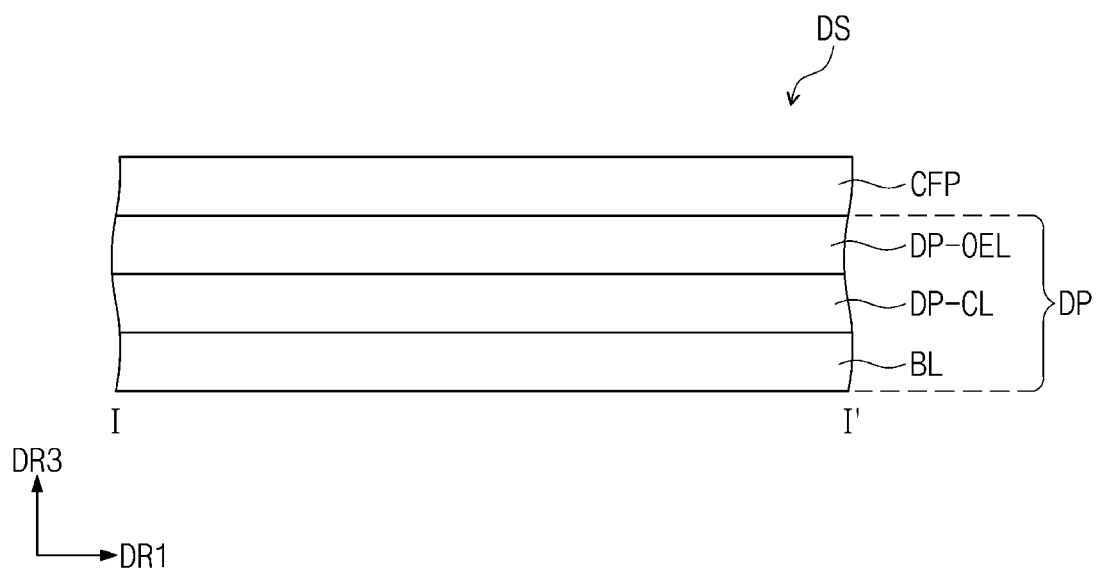
FIG. 2 is a schematic cross-sectional view illustrating the display device according to an embodiment.

FIG. 1A is a perspective view illustrating a display device according to an embodiment. FIG. 1B is a perspective view illustrating a state in which the display device is folded according to an embodiment. FIG. 2 is a schematic cross-sectional view illustrating the display device according to an embodiment.

Referring to FIG. 1A, a display device DS may display an image or images IM through a display surface IS. In FIG. 1A, the display surface IS may be parallel to a surface defined by a first directional axis DR1 and a second directional axis DR2 crossing the first directional axis DR1. However, this is merely an example. In an embodiment, the display surface IS of the display device DS may have a substantially curved shape.

A normal direction of the display surface IS, for example, a thickness direction of the display device DS, indicates a third directional axis DR3. A front surface (or top surface) and a rear surface (or bottom surface) of each of the members may be distinguished by the third directional axis DR3. However, directions indicated by the first to third directional axes DR1, DR2, and DR3 may be relative concepts and may be alternated with respect to each other. Hereinafter, first to third directions may be defined as directions indicated by the first to third directional axes DR1, DR2, and DR3 and designated by the same reference numerals, respectively.

In FIG. 1A, a portable electronic device is illustrated as an example of the display device DS. However, the display device DS may be used for large-sized electronic devices such as televisions, monitors, or indoor/outdoor advertisement boards and small and medium-sized electronic devices such as personal computers, notebook computers, personal digital terminals, navigation units for vehicles, game consoles, smartphones, tablet computers, and cameras, by way of non-limiting examples. The above-described devices are exemplified as merely an embodiment, and thus, the display device DS may be applied to other electronic devices within the spirit and scope of the disclosure.

The display surface IS may include a display area DA on which the image IM may be displayed and a non-light emitting area NDA disposed adjacent to the display area DA. The non-light emitting area NDA may be an area on which an image may not be displayed. In FIG. 1A, a clock window and application icons are illustrated as an example of the image IM.

The display area DA may be provided as a plane defined by the first direction DR1 and the second direction DR2. The non-light emitting area NDA may surround or be adjacent to the display area DA. However, an embodiment is not limited thereto. For example, the shapes of the display area DA and the non-light emitting area NDA may be relatively designed. As an example, the non-light emitting area NDA may not exist on a front surface of the display device DS.

Referring to FIG. 1B, the display device DS according to an embodiment may be folded along a direction. For example, the display device DS may be folded with a predetermined curvature along a virtual folding axis FX extending in the first direction DR1. In FIG. 1B, the display device DS may be exemplarily deformed into an in-folding state in which the display surfaces IS may face each other.

However, an embodiment is not limited thereto. For example, the display device DS may be deformed into an in-folding state in which the display surface IS may face a rear surface of the display device DS, which may be opposite to the display surface IS facing each other, or the display device DS may be folded with respect to two or more folding axes. Although the display device DS may have an area bent with a predetermined curvature, an embodiment is not limited thereto.

Referring to FIG. 2, the display device DS according to an embodiment may include a display panel DP and a color filter member CFP. The display device DS may include a gradation display layer that may generate an image. The gradation display layer may include one of a liquid crystal display panel, an organic electroluminescent light emitting display panel, and an electrophoretic display panel according to the type of the display panel DP. It is to be understood that 'member' may include layer. Thus, the color filter member CFP may a color filter layer within the spirit and the scope of the disclosure.

In an embodiment, the display panel DP may include a base layer BL, and a circuit layer DP-CL and a display element layer DP-OEL, which may be provided or disposed on the base layer BL. In an embodiment, the base layer BL, the circuit layer DP-CL, and the display element layer DP-OEL may be sequentially laminated in a direction of the third directional axis DR3.

The base layer BL may be a member providing a base surface on which the display element layer DP-OEL may be disposed. The base layer BL may include a glass substrate, a metal substrate, a plastic substrate, or other material within the spirit and the scope of the disclosure. However, an embodiment is not limited thereto. For example, the base layer BL may include at least one of an organic layer, an inorganic layer, or a composite layer, which may contain polyimide.

In an embodiment, the circuit layer DP-CL may be disposed on the base layer BL and may include transistors (not shown). Each of the transistors (not shown) may include a control electrode, an input electrode, and an output electrode. For example, the circuit layer DP-CL may include a driving transistor and a switching transistor that may drive an organic electroluminescent light emitting element. Thus, the display panel DP, which may be a gradation display layer in an embodiment, may be an organic electroluminescent light emitting display panel.

In an embodiment, the display element layer DP-OEL may include an organic luminescent light emitting element electrically connected to the circuit layer DP-CL and a sealing member covering or overlapping the organic luminescent light emitting element. Thus, since moisture and oxygen introduced to the organic luminescent light emitting element may be blocked as the organic luminescent light emitting element may be sealed by the sealing member, the display device DS may have improved reliability.

The color filter member CFP may be disposed on the display panel DP. The color filter member CFP may be an anti-reflection member that may minimize reflection caused by light incident from the outside. For example, the color filter member CFP may block a portion of external light. The color filter member CFP may be disposed on the display panel DP and may reduce the reflection caused by the external light and minimize luminance degradation.

Figure 3A:
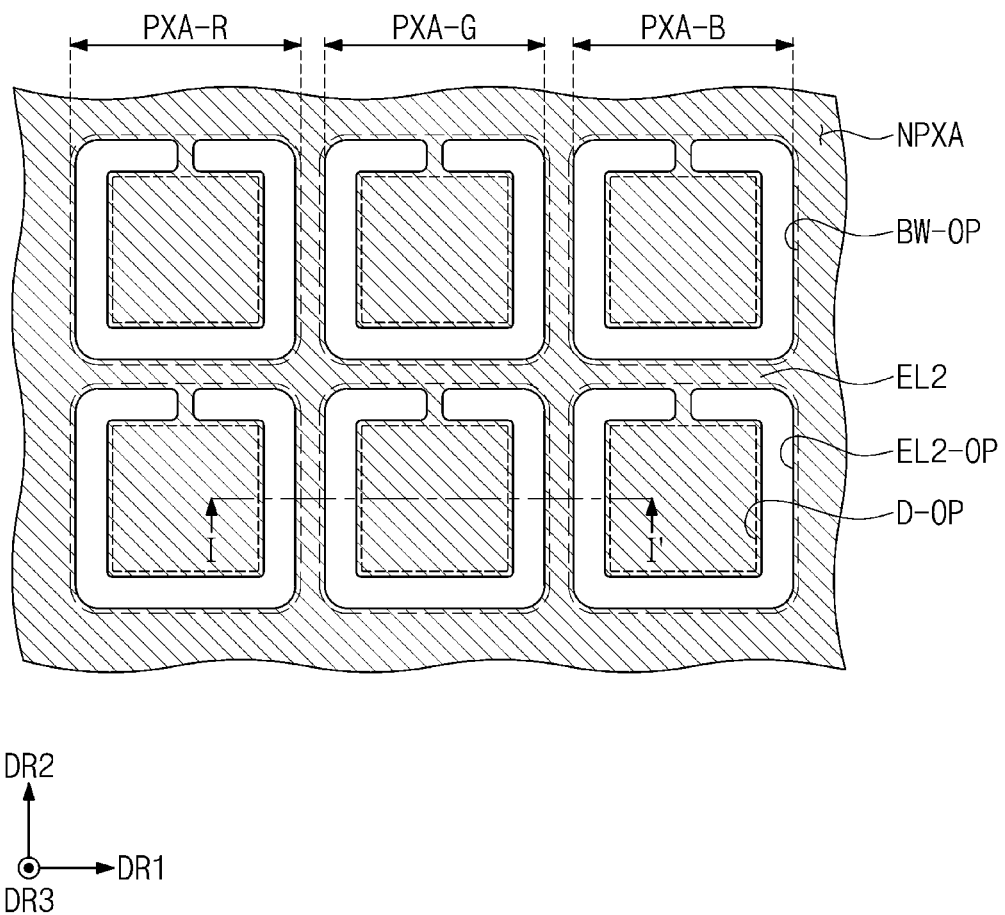
FIG. 3A is a plan view illustrating a display area of a display panel according to an embodiment.
Figure 3B:
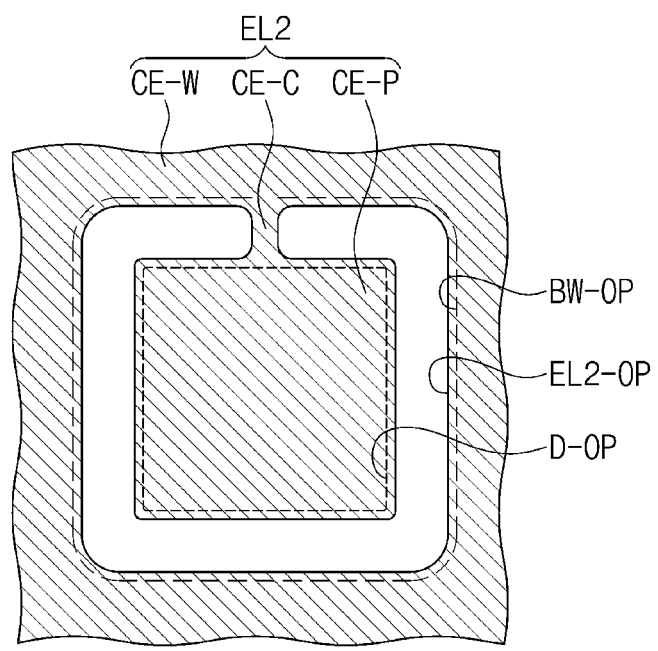
FIG. 3B is an enlarged plan view illustrating one area of the display area of the display panel in FIG. 3A.
Figure 3B:
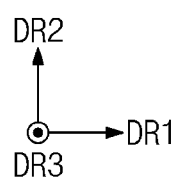
Figure 4:
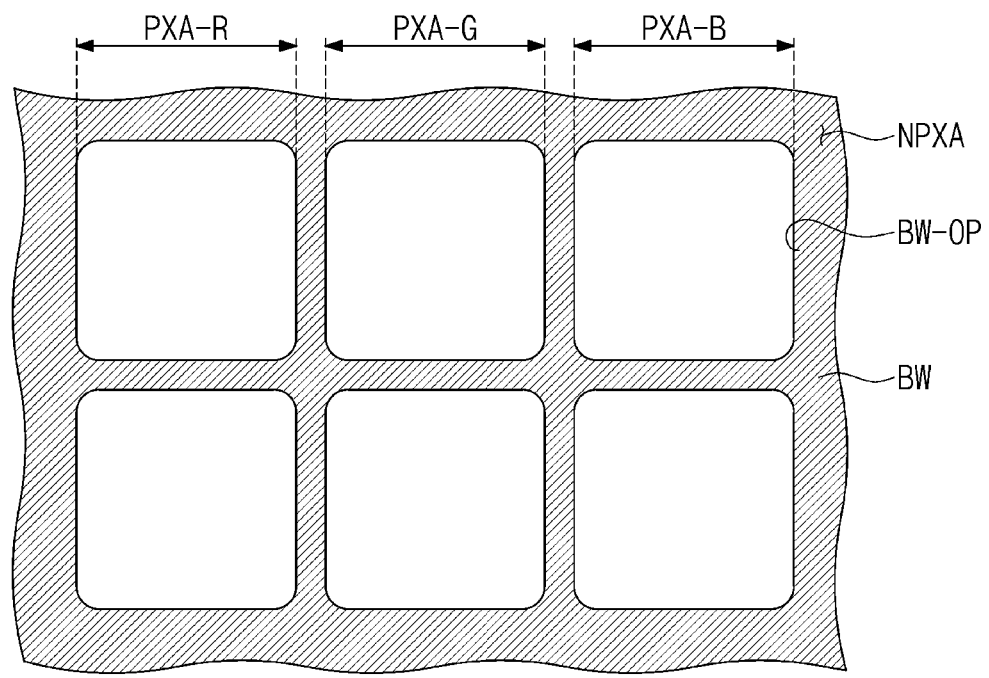
FIG. 4 is a plan view illustrating one configuration of the display device according to an embodiment.
Figure 4:
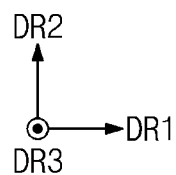
Figure 5:
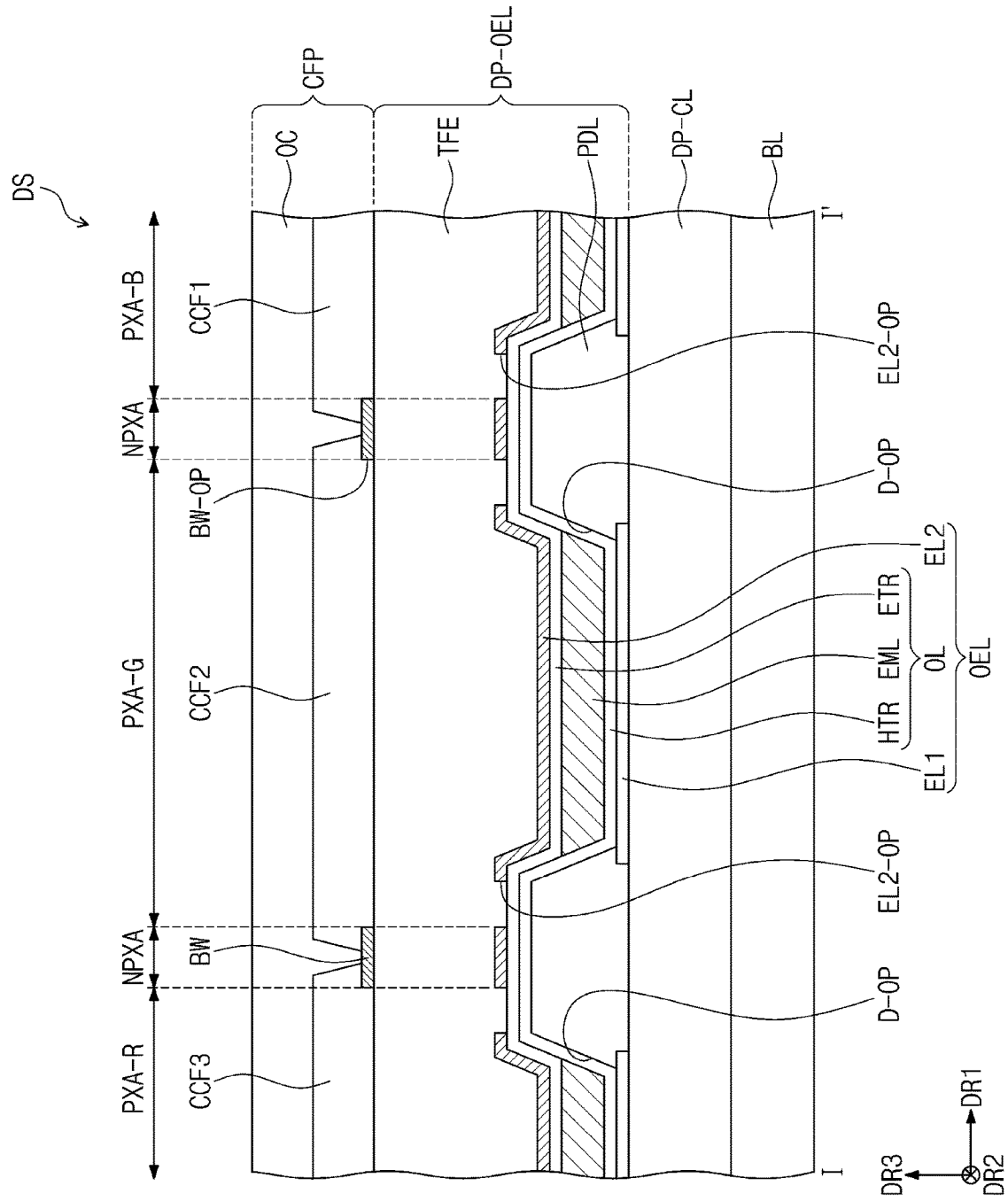
FIG. 5 is a schematic cross-sectional view taken along line I-I' of FIG. 3A.

FIG. 3A is a plan view illustrating a display area of the display panel according to an embodiment. FIG. 3B is an enlarged plan view illustrating an area of the display area of the display panel in FIG. 3A. FIG. 4 is a plan view illustrating a configuration of the display device according to an embodiment. FIG. 5 is a schematic cross-sectional view taken along line I-I' of FIG. 3A. The same or similar components as those described in FIGS. 1A to 2 will be designated by the same or similar reference numerals, respectively, and repeated description thereof will be omitted.

Referring to FIGS. 3A, 3B, and 5, the display panel DP according to an embodiment may include a base layer BL, a circuit layer DP-CL, and a display element layer DP-OEL. Although not shown, an organic electroluminescent light emitting element OEL of the display element layer DP-OEL may be electrically connected to a transistor (not shown) of the circuit layer DP-CL.

Each of the organic electroluminescent light emitting elements OEL according to an embodiment may include a first electrode EL1, a hole transporting region HTR disposed on the first electrode EL1, a light emitting pattern EML disposed on the hole transporting region HTR, an electron transporting region ETR disposed on the light emitting pattern EML, and a second electrode EL2 disposed on the electron transporting region ETR. The light emitting pattern EML may be distinguished by a pixel defining layer PDL.

The pixel defining layer PDL may be disposed on the circuit layer DP-CL. A display opening D-OP exposing at least a portion of the first electrode EL1 may be defined in the pixel defining layer PDL. The pixel defining layer PDL may be made of a polymer resin. For example, the pixel defining layer PDL may include a polyacrylate-based resin or a polyimide-based resin. The pixel defining layer PDL may include an inorganic material in addition to the polymer resin.

The first electrode EL1 may be disposed on the circuit layer DP-CL. The first electrode EL1 may be exposed from the pixel defining layer PDL by the display opening D-OP. The first electrode EL1 may be electrically connected to a transistor (not shown) of the circuit layer DP-CL through a contact hole (not shown) defined in the circuit layer DP-CL.

The light emitting pattern EML may be disposed in the display opening D-OP defined in the pixel defining layer PDL. The light emitting pattern EML may contain a light emitting material. For example, the light emitting pattern EML may be made of at least one of materials emitting red light, green light, and blue light, respectively, and may contain a fluorescent material or a phosphorescent material. The light emitting pattern EML may contain an organic light emitting material or an inorganic light emitting material. The light emitting pattern EML may emit light in response to a potential difference between the first electrode EL1 and the second electrode EL2.

The second electrode EL2 may be disposed on the light emitting pattern EML. The second electrode EL2 may face the first electrode EL1. The second electrode EL2 may be provided in common to the organic electroluminescent light emitting elements OEL. The light emitting pattern EML disposed on each of the organic electroluminescent light emitting elements OEL may receive a common power voltage through the second electrode EL2.

The second electrode EL2 may contain a transmissive conductive material or a semi-transmissive conductive material. Thus, light emitted from the light emitting pattern EML may be emitted through the second electrode EL2 in the third direction DR3.

However, this is merely an example. For example, the organic electroluminescent light emitting elements OEL may be driven by a rear light emitting method, in which the first electrode EL1 may contain a transmissive conductive material or a semi-transmissive conductive material, or by a both surface light emitting method emitting light toward both front and rear surfaces depending on design. However, an embodiment is not limited thereto. The light emitting pattern EML may be contained in each of the organic electroluminescent light emitting elements OEL, or as the light emitting pattern EML is provided in plurality, the light emitting patterns EML may be contained in the organic electroluminescent light emitting elements OEL, respectively. On the other hand, the second electrode EL2 may have an integrated shape disposed on a front surface of the circuit layer DP-CL. Thus, the organic electroluminescent light emitting elements OEL may receive a common voltage by the second electrode EL2 having the integrated shape.

Although not shown in the drawing, in an embodiment, the organic electroluminescent light emitting elements OEL may include at least one auxiliary layer (not shown) between the first electrode EL1 and the second electrode EL2. Whether the auxiliary layer (not shown) may be provided, a thickness of the auxiliary layer (not shown), and the number of the auxiliary layers (not shown) may be varied according to a wavelength range of emitted light. The auxiliary layer (not shown) may be an organic layer that may adjust a resonance distance in the organic electroluminescent light emitting elements OEL.

An encapsulation member TFE may be disposed on the organic electroluminescent light emitting elements OEL. The encapsulation member TFE may be disposed on the second electrode EL2. The encapsulation member TFE may be disposed directly on the second electrode EL2. The encapsulation member TFE may be a single layer or laminated layers. For example, the encapsulation member TFE may have a laminated structure including inorganic layers and an organic layer sealed from the inorganic layers. The encapsulation member TFE may be a thin-film encapsulation layer. The encapsulation member TFE may protect the organic electroluminescent light emitting elements OEL from moisture and oxygen introduced from the outside.

The display device DS may include a color filter member CFP disposed on the display panel DP. The color filter member CFP may include color filters CCF1, CCF2, and CCF3. The color filters CCF1, CCF2, and CCF3 may be spaced apart from each other in a plan view. The color filters CCF1, CCF2, and CCF3 may not overlap each other.

The color filters CCF1, CCF2, and CCF3 may be spaced apart from each other in a plan view, and the color filters CCF1, CCF2, and CCF3 may be disposed in correspondence to light emitting areas PXA-B, PXA-G, and PXA-R, respectively.

In an embodiment, a first color filter CCF1 may be a blue color filter emitting blue light, a second color filter CCF2 may be a green color filter emitting green light, and a third color filter CCF3 may be a red color filter emitting red light.

Each of the color filters CCF1, CCF2, and CCF3 may contain a polymer photosensitive resin and a pigment or a dye. The first color filter CCF1 may contain a blue pigment or dye, the second color filter CCF2 may contain a green pigment or dye, and the third color filter CCF3 may contain a red pigment or dye.

However, an embodiment is not limited thereto. For example, the first color filter CCF1 may not contain a pigment or a dye. The first color filter CCF1 may contain a polymer photosensitive resin and may not contain a pigment or a dye. The first color filter CCF1 may be transparent. The first color filter CCF1 may be made of a transparent photosensitive resin.

In an embodiment, the color filter member CFP may include a division pattern BW and an organic layer OC.

In an embodiment, the division pattern BW may be disposed on the encapsulation member TFE. The division pattern BW may overlap the pixel defining layer PDL. Thus, the division pattern BW may not overlap the display opening D-OP defined in the pixel defining layer PDL. The division pattern BW may not overlap the light emitting pattern EML. A division opening BW-OP overlapping the display opening D-OP may be defined in the division pattern BW.

An area of the division opening BW-OP may be defined as a maximum area in which light generated from one organic electroluminescent light emitting element OEL may be emitted without being mixed with another organic electroluminescent light emitting element disposed adjacent thereto. Thus, in a plan view, an area on which the division pattern BW may be disposed may be defined as a non-light emitting area NPXA, and an area corresponding to the division opening BW-OP may be defined as light emitting areas PXA-R, PXA-G, and PXA-B to which the light generated from the organic electroluminescent light emitting element OEL may be provided.

The division pattern BW, which may be a pattern having a black color, may be a black matrix. The division pattern BW may include a black coloring agent. The black coloring agent may include a black pigment and/or a black dye. The black coloring agent may include a metal such as chrome and carbon black or an oxide thereof.

The division opening BW-OP defined in the division pattern BW may be differently defined according to optical characteristics of the division pattern BW. The division openings BW-OP corresponding to the light emitting areas PXA-R, PXA-G, and PXA-B, respectively, may be defined in the division pattern BW blocking almost an entire wavelength range of visible rays as in an embodiment. However, a fewer number of division openings BW-OP may be defined in the division pattern BW that may allow at least one of a specific color light (for example, red light, green light, or blue light) to transmit therethrough.

The organic layer OC may be disposed on the color filters CCF1, CCF2, and CCF3. The organic layer OC may surround an unevenness of each of the color filters CCF1, CCF2, and CCF3. For example, the organic layer OC may be a planarization layer in the color filter member CFP. The organic layer OC may be filled between the color filters CCF1, CCF2, and CCF3 and the division pattern BW and may flatten a top surface, which may be exposed to the outside, of the color filter member CFP.

The organic layer OC may be a protection layer that may protect the color filters CCF1, CCF2, and CCF3. The organic layer OC may be transparent. The organic layer OC may be made of a polymer resin. The organic layer OC may contain a functional material in addition to the polymer resin. For example, the organic layer OC may contain functional materials such as a light absorbing agent and an antioxidant agent. In an embodiment, the organic layer OC may contain a scattering agent.

According to an embodiment, an emission area of light provided from the organic electroluminescent light emitting element OEL may be determined according to an area of the division opening BW-OP defined in the division pattern BW. Thus, as interference between the light provided from the organic electroluminescent light emitting element OEL and the division pattern BW is minimized, a light emitting efficiency may increase.

According to an embodiment, the division opening BW-OP may have an area greater than that of the display opening D-OP defined in the pixel defining layer PDL. Thus, a defect, in which the second electrode EL2, which may overlap the light emitting pattern EML, of the second electrodes EL2 overlapping the light emitting areas PXA-R, PXA-G, and PXA-B reflects external light and thus is seen to a user, may occur.

FIG. 4 illustrates a relationship between the division pattern BW of the color filter member CFP and the light emitting areas PXA-R, PXA-G, and PXA-B and the non-light emitting area NPXA. An area on which the division pattern BW may be disposed may be defined as the non-light emitting area NPXA, and the division opening defined in the division pattern BW may be defined as the light emitting areas PXA-R, PXA-G, and PXA-B.

Referring to FIGS. 3A and 3B again, the second electrode EL2 according to an embodiment may have a shape in which a portion, which may not overlap the light emitting pattern EML, of portions overlapping the light emitting areas PXA-R, PXA-G, and PXA-B may be patterned.

In an embodiment, the second electrode EL2 may include an electrode opening EL2-OP that may overlap the division opening BW-OP and may not overlap the display opening D-OP. The electrode opening EL2-OP may be provided to each of the light emitting areas PXA-R, PXA-G, and PXA-B. Thus, the second electrode EL2 may overlap at least a portion of the division pattern BW and at least a portion of the light emitting pattern EML in a plan view. As illustrated in FIG. 5, a portion of the electron transporting region ETR may be exposed from the second electrode EL2 by the electrode opening EL2-OP in an area overlapping the light emitting areas PXA-R, PXA-G, and PXA-B, for example, an area overlapping the division opening BW-OP.

However, an embodiment is not limited thereto. Although a portion of one of the hole transporting region HTR and the pixel defining layer PDL may be exposed from the second electrode EL2 by the electrode opening EL2-OP as components disposed thereabove may be omitted in the area overlapping the light emitting areas PXA-R, PXA-G, and PXA-B, for example, an area overlapping the division opening BW-OP, an embodiment is not limited thereto.

In FIGS. 3A and 3B, areas overlapping the second electrode EL2 in a plan view may be expressed by a dotted line for convenience of description.

Referring to FIG. 3B, in an embodiment, the second electrode EL2 may include a first portion CE-P, a second portion CE-W, and a third portion CE-C. The first portion CE-P, the second portion CE-W, and the third portion CE-C are components that may substantially constitute one second electrode EL2, and may be distinguished for convenience of description.

The first portion CE-P may overlap at least a portion of the light emitting pattern EML. The first portion CE-P of the second electrode EL2, which may be a portion that may provide an electric field to the light emitting pattern EML in conjunction with the corresponding first electrode EL1, may be a necessary portion that may be essential for generating light. The first portion CE-P may be disposed on each of the light emitting areas PXA-R, PXA-G, and PXA-B.

The second portion CE-W may overlap at least a portion of the division pattern BW. As the second electrode EL2 may be provided on the front surface of the circuit layer DP-CL, the second portion CE-W of the second electrode EL2 may overlap the non-light emitting area NPXA on which the division pattern BW adjacent thereto may be disposed.

The third portion CE-C may extend from the first portion CE-P to the second portion CE-W. The third portion CE-C may connect the second portion CE-W, which may overlap the non-light emitting area NPXA, to the first portion CE-P overlapping the light emitting areas PXA-R, PXA-G, and PXA-B in order to apply a common voltage to the first portion CE-P overlapping the light emitting areas PXA-R, PXA-G, and PXA-B.

In an embodiment, the first portion CE-P may have an area greater than that of the third portion CE-C. The electrode opening EL2-OP may be provided by removing the remainder of the second electrode EL2 except for the first portion CE-P and the third portion CE-C disposed on the light emitting areas PXA-R, PXA-G, and PXA-B.

According to an embodiment, as the remainder except for a predetermined portion, which may be essential to generate light, of the second electrode EL2 overlapping the light emitting areas PXA-R, PXA-G, and PXA-B is removed, the defect, in which light incident to the light emitting areas PXA-R, PXA-G, and PXA-B may be reflected by an unnecessary portion of the second electrode EL2 and seen to the user, may be minimized. Thus, the display device having improved visibility may be provided.

Figure 6A:
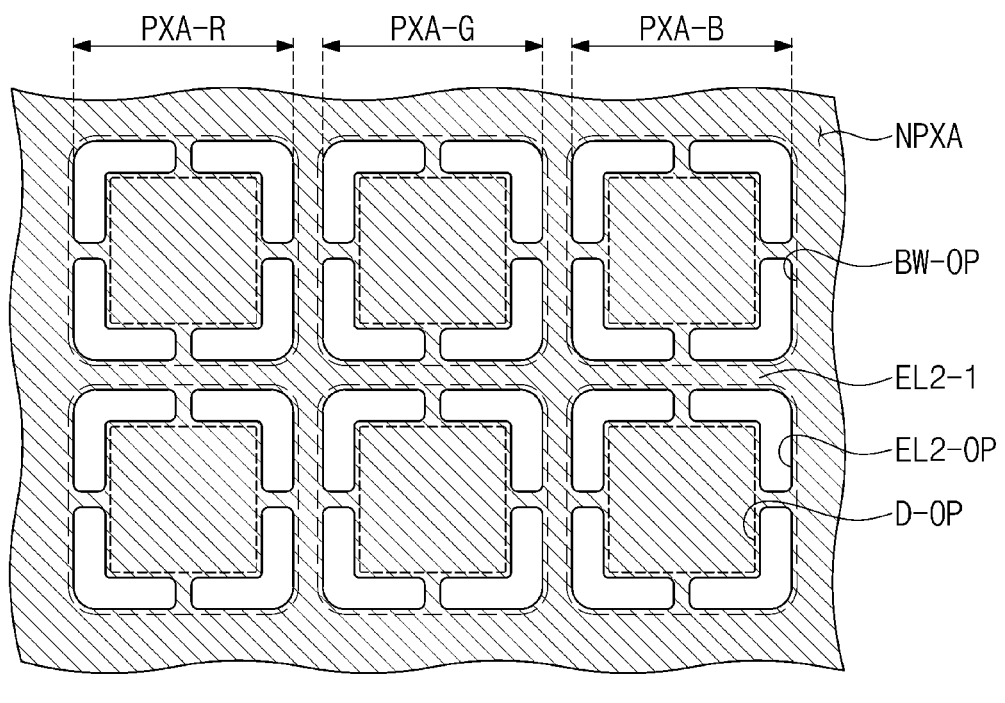
FIG. 6A is a plan view illustrating a display area of a display panel according to an embodiment.
Figure 6B:
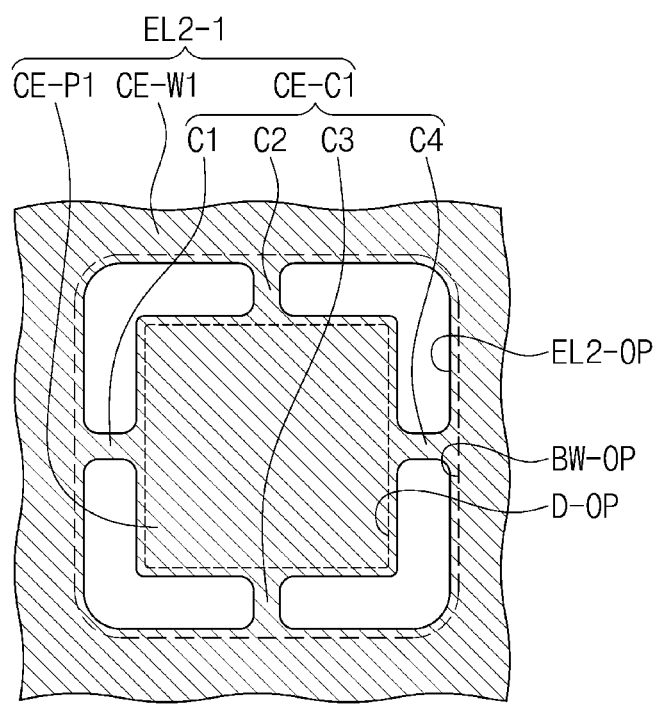
FIG. 6B is an enlarged plan view illustrating one area of the display area of the display panel in FIG. 6A.

FIG. 6A is a plan view illustrating a display area of a display panel according to an embodiment. FIG. 6B is an enlarged plan view illustrating an area of the display area of the display panel in FIG. 6A. The same or similar components as those in FIGS. 1A to 5 will be designated by the same or similar reference numerals, respectively, and repeated description thereof will be omitted.

Referring to FIGS. 6A and 6B, in an embodiment, a second electrode EL2 may include a first portion CE-P1, a second portion CE-W1, and a third portion CE-C1.

The first portion CE-P1 may be disposed on each of light emitting areas PXA-R, PXA-G, and PXA-B. The second portion CE-W1 may overlap a non-light emitting area NPXA. The third portion CE-C1 may extend from the first portion CE-P1 to the second portion CE-W1.

In an embodiment, the third portion CE-C1 may be provided in plurality in one light emitting area. For example, the third portion CE-C1 may include first to fourth connectors C1, C2, C3, and C4. The first to fourth connectors C1, C2, C3, and C4 may be spaced apart from each other in one light emitting area and each may extend from different portions of the first portion CE-P1 to the second portion CE-W1.

As the third portion CE-C1 may be provided in plurality, an electrode opening EL2-OP may be also provided in plurality in correspondence thereto. Thus, the electrode openings EL2-OP may be provided in the one light emitting area.

In an embodiment, as the third portion CE-C1 may include the first to fourth connectors C1, C2, C3, and C4, although one of the first to fourth connectors C1, C2, C3, and C4 may be disconnected from the first portion CE-P1, the first portion CE-P1 may be electrically connected to the second portion CE-W1 to further stably drive the organic electroluminescent light emitting element OEL (refer to FIG. 5).

Figure 7:
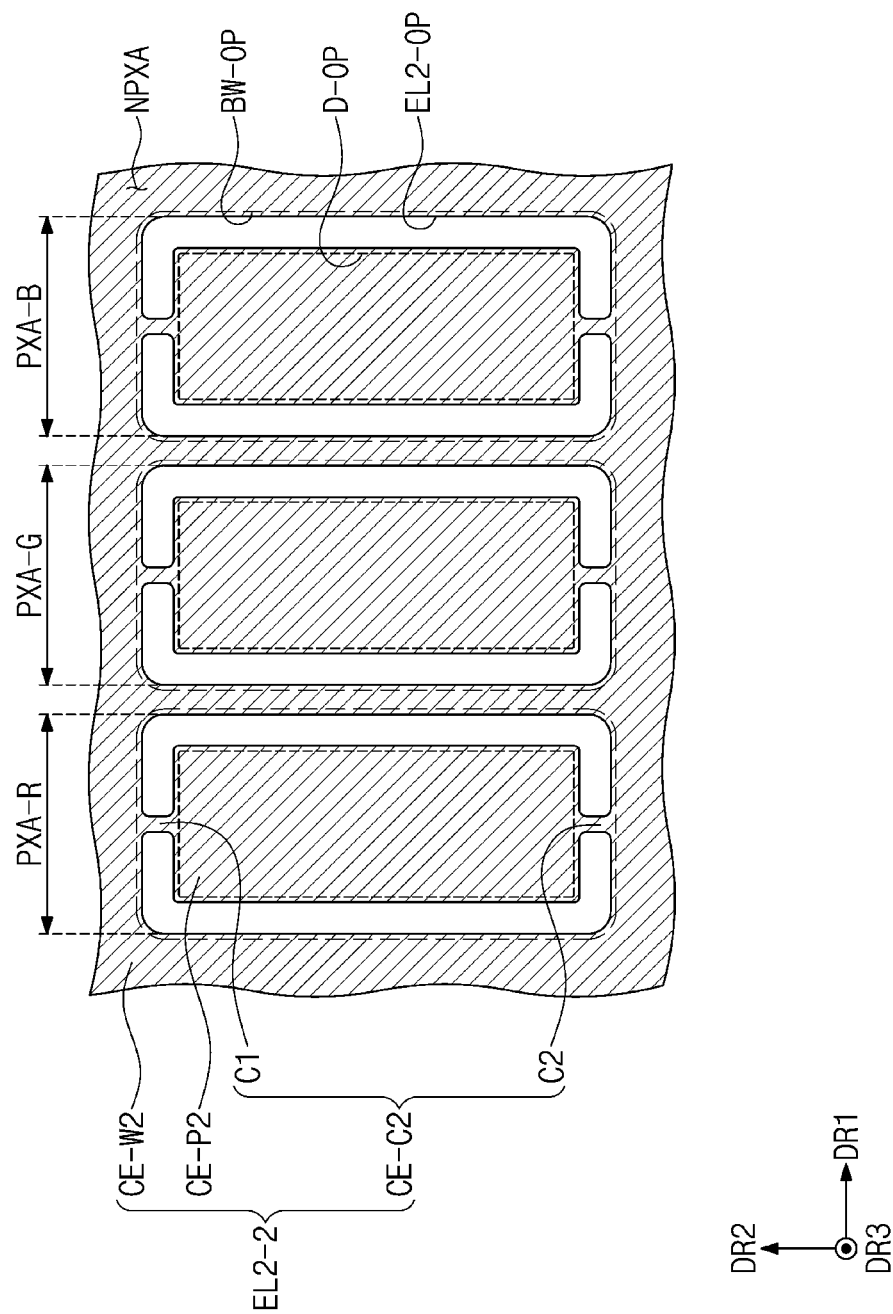
FIG. 7 is a plan view illustrating a display area of a display panel according to an embodiment.

FIG. 7 is a plan view illustrating a display area of a display panel according to an embodiment. The same or similar components as those in FIGS. 1A to 5 will be designated by the same or similar reference numerals, respectively, and repeated description thereof will be omitted.

Referring to FIG. 7, in an embodiment, a second electrode EL2-2 may include a first portion CE-P2, a second portion CE-W2, and a third portion CE-C2.

The first portion CE-P2 may be disposed on each of light emitting areas PXA-R, PXA-G, and PXA-B. The second portion CE-W2 may overlap a non-light emitting area NPXA. The third portion CE-C2 may extend from the first portion CE-P2 to the second portion CE-W2.

In an embodiment, the third portion CE-C2 may include first and second connectors C1 and C2 that may be spaced apart from each other with the first portion CE-P2 therebetween in the second direction DR2. However, this is merely an example, and an embodiment is not limited to the number and shape of the third portion CE-C2 as long as the third portion CE-C2 connects the first portion CE-P2 with the second portion CE-W2.

In an embodiment, the first portion CE-P2 may have an area in the first direction DR1, which may be different from an area in the second direction DR2. For example, the first portion CE-P2 may extend in the second direction DR2.

In an embodiment, an area of the light emitting areas PXA-R, PXA-G, and PXA-B corresponding to the division openings BW-OP may be varied according to purposes, and an area of each of the display opening D-OP and the first portion CE-P2 may be also varied in correspondence thereto.

Figure 8:
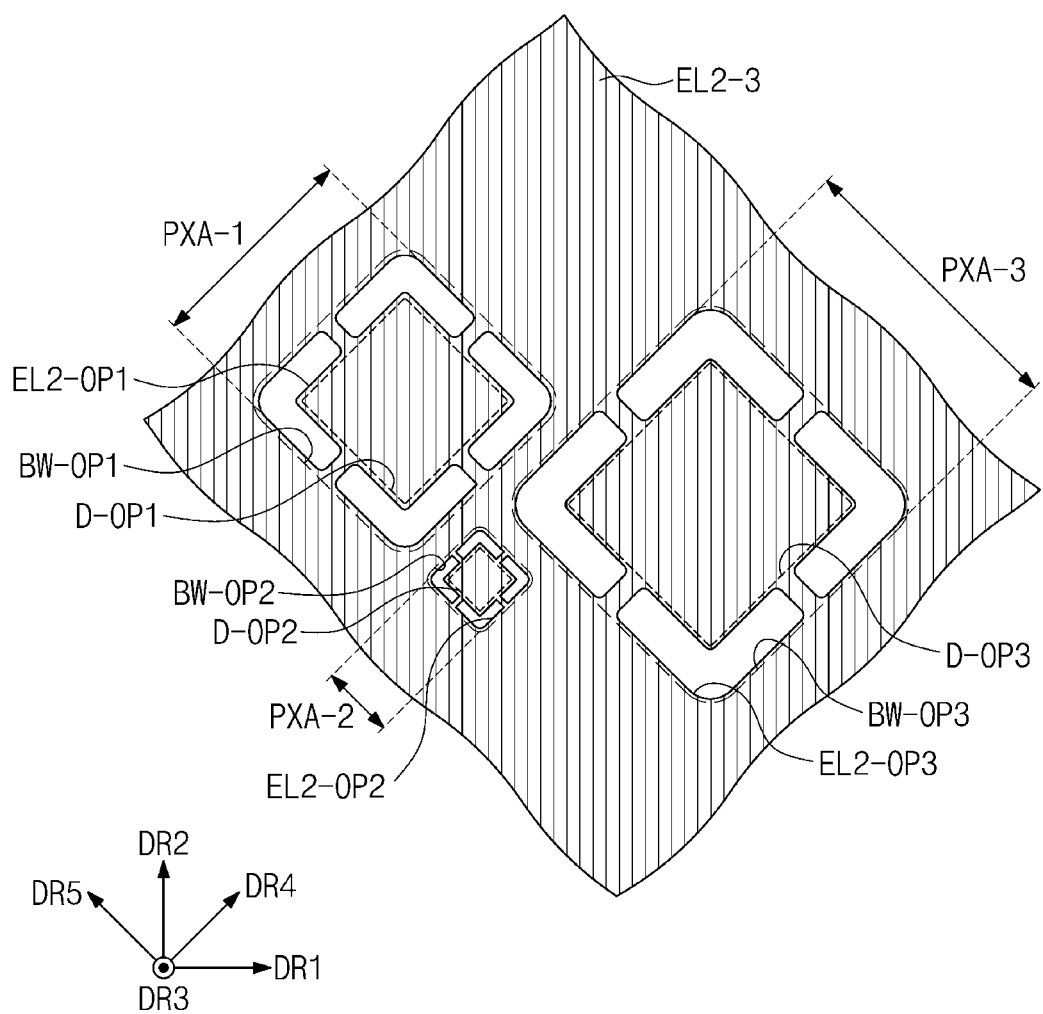
FIG. 8 is a plan view illustrating a display area of a display panel according to an embodiment.

FIG. 8 is a plan view illustrating a display area of a display panel according to an embodiment. The same or similar components as those in FIGS. 1A to 5 will be designated by the same or similar reference numerals, respectively, and repeated description thereof will be omitted.

Referring to FIG. 8, light emitting areas PXA-R, PXA-G, and PXA-B corresponding to a division opening BW-OP may have a pentile structure. The pentile structure may be defined such that the light emitting areas PXA-R, PXA-G, and PXA-B having different areas may be arranged or disposed in a substantially diamond shape.

Thus, the second electrodes EL2-3, which may be disposed on the light emitting areas PXA-R, PXA-G, and PXA-B, respectively, of the second electrodes EL2-3 may have different areas from each other. Thus, each of the division opening BW-OP and the display opening D-OP may also have a different area for each of the light emitting areas PXA-R, PXA-G, and PXA-B.

Although FIG. 8 illustrates light emitting areas PXA-1, PXA-2, PXA-3, division openings BW-OP1, BW-OP2, and BW-OP3, display openings D-OP1, D-OP2, and D-OP3, and electrode openings EL2-OP1, EL2-OP2 and EL2-OP3, disposed as shown and including fourth and fifth directions, DR4 and DR5, respectively, an embodiment is not limited thereto.

Figure 9:
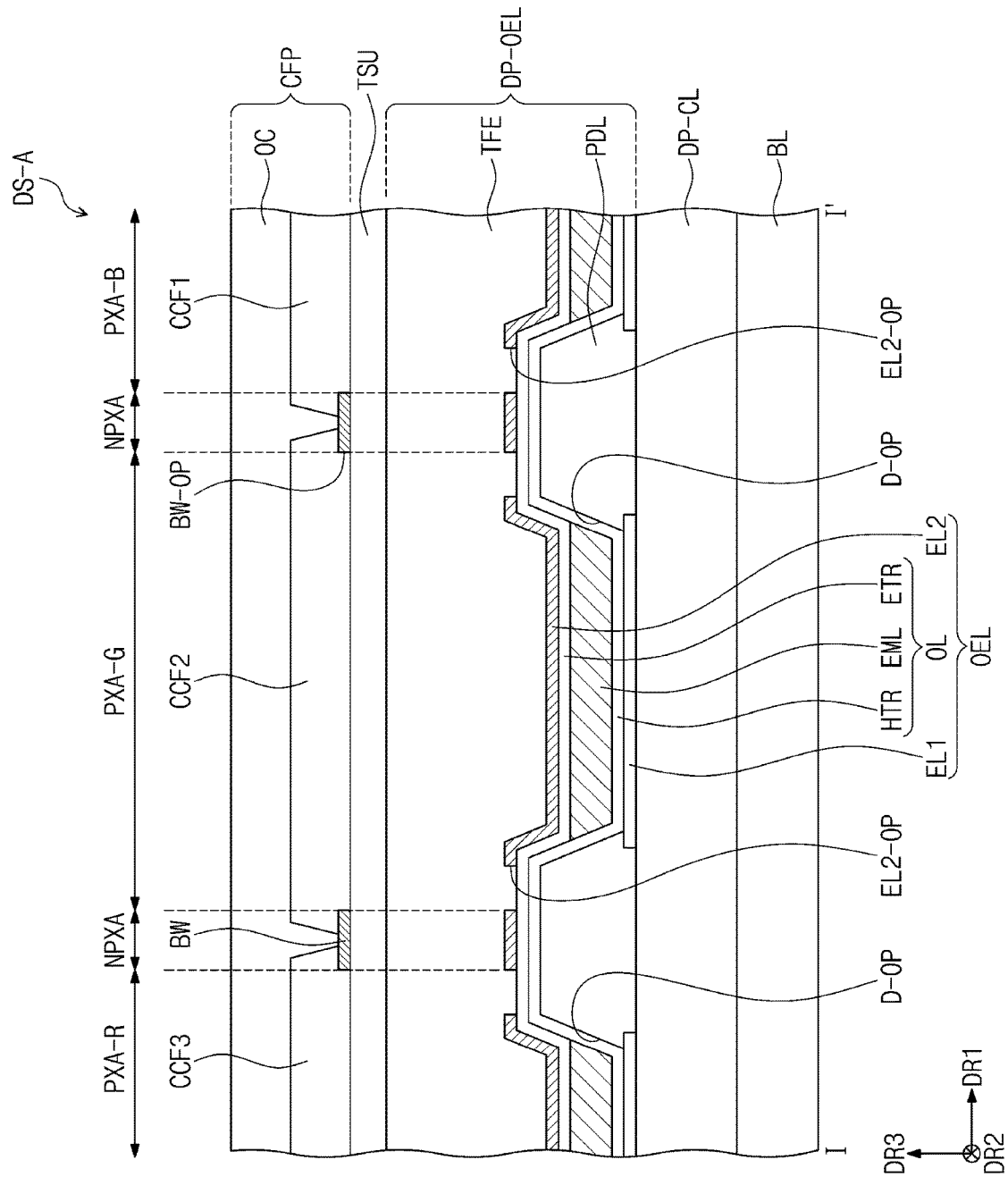
FIG. 9 is a schematic cross-sectional view illustrating a display device according to an embodiment.

FIG. 9 is a schematic cross-sectional view illustrating a display device according to an embodiment. The same or similar components as those in FIGS. 1A to 5 will be designated by the same or similar reference numerals, respectively, and overlapped description thereof will be omitted.

A display device DS-A according to an embodiment may include a base layer BL, a circuit layer DP-CL, a display element layer DP-OEL, a detection sensor TSU, and a color filter member CFP.

The detection sensor TSU may be disposed between the display element layer DP-OEL and the color filter member CFP. The detection sensor TSU may detect an external input.

The external input may include various types of inputs provided from the outside of the display device DS-A. The external input applied from the outside may be provided in various types. For example, the external input may include contact that is generated by a portion of a user's body such as hands and an external input (for example, hovering) that may be applied by being adjacent to the display device DS-A or being disposed adjacent by a predetermined distance. The external input may have various types such as force, pressure, and light. However, an embodiment is not limited thereto.

The detection sensor TSU may include insulation layers (not shown) and conductive layers (not shown) disposed between the insulation layers. The insulation layers (not shown) may include an organic and/or inorganic material.

For example, the conductive layers may detect the external input by a self-capacitance method or a mutual capacitance method. The conductive layers may be variously appropriately deformed according to the method to be disposed and connected as long as the conductive layers may detect the external input. However, an embodiment is not limited thereto.

Figure 10:
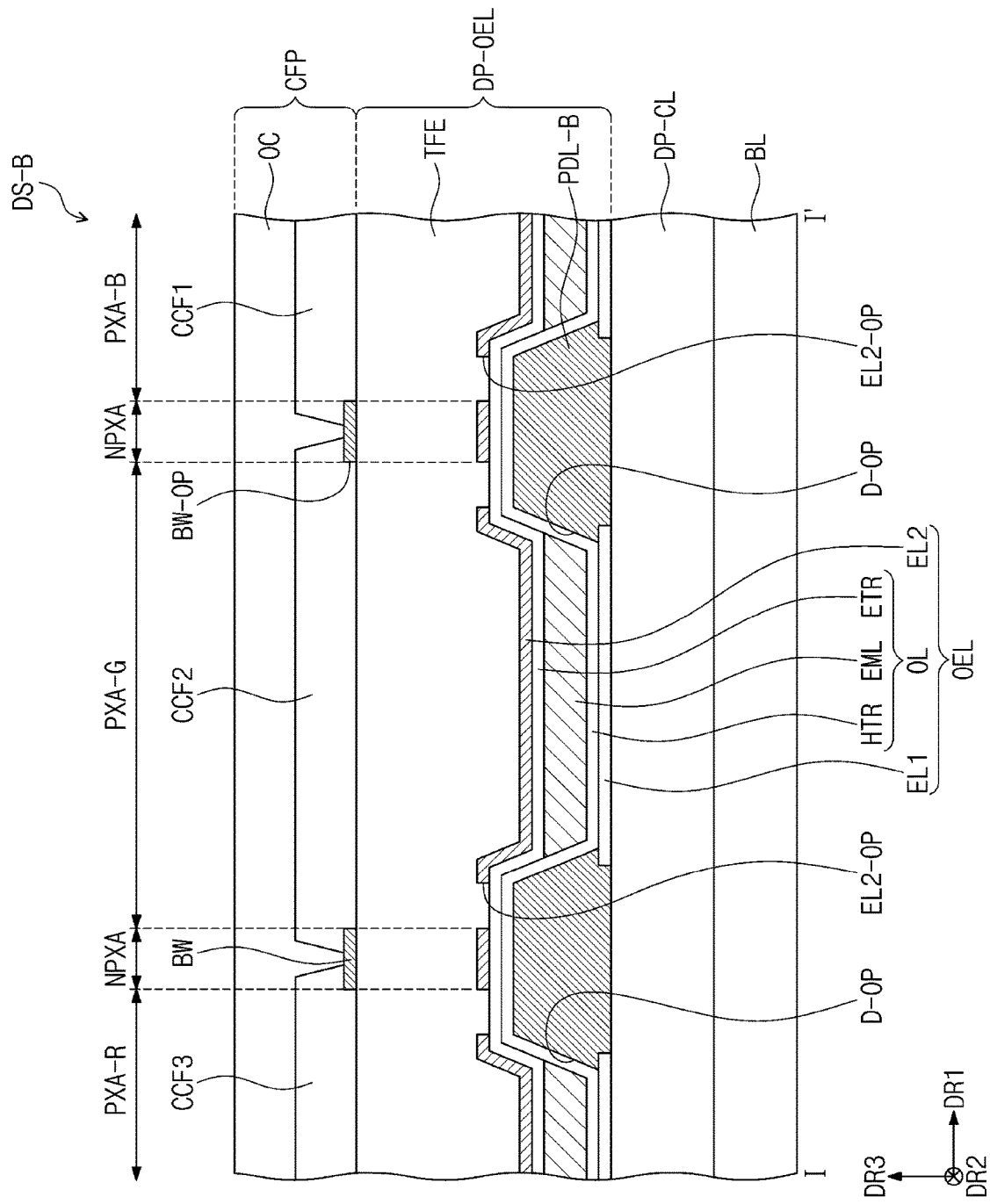
FIG. 10 is a schematic cross-sectional view of a display device according to an embodiment.

FIG. 10 is a schematic cross-sectional view of a display device according to an embodiment. The same or similar components as those in FIGS. 1A to 5 will be designated by the same or similar reference numerals, respectively, and repeated description thereof will be omitted.

A display device DS-B according to an embodiment may include a base layer BL, a circuit layer DP-CL, a display element layer DP-OEL, and a color filter member CFP.

In an embodiment, a pixel defining layer PDL-B may have a black color. The pixel defining layer PDL-B may contain a light absorbing material or a black pigment or dye. The pixel defining layer PDL-B containing the black pigment or dye may realize a black-pixel defining layer. Although carbon black may be used as the black pigment or dye of the pixel defining layer PDL-B, an embodiment is not limited thereto.

Figure 11:
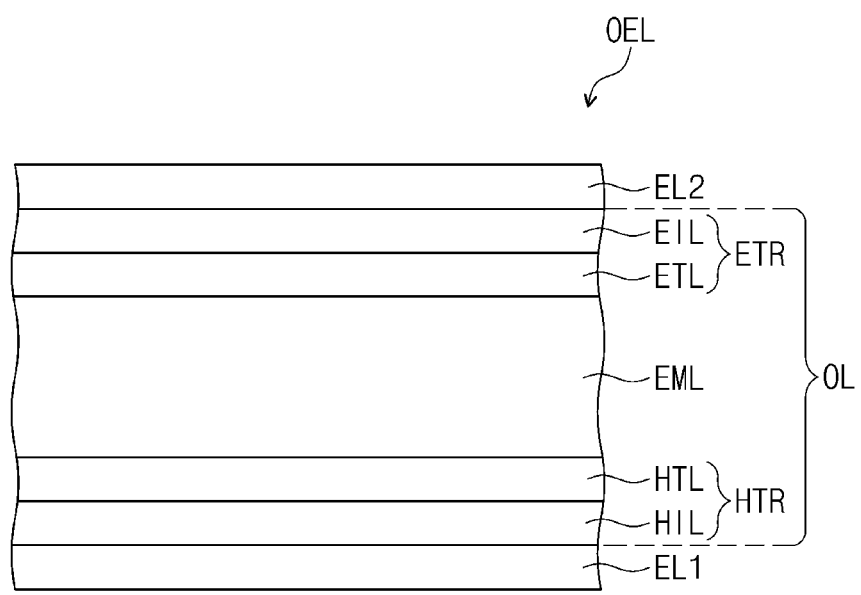
FIG. 11 is a schematic cross-sectional view illustrating an organic electroluminescent light emitting element according to an embodiment.

FIG. 11 is a schematic cross-sectional view illustrating the organic electroluminescent light emitting element according to an embodiment. The same or similar components as those in FIGS. 1A to 5 will be designated by the same or similar reference numerals, respectively, and overlapped description thereof will be omitted.

FIG. 11 is a schematic cross-sectional view illustrating a layer structure of the organic electroluminescent light emitting element OEL in FIG. 5.

The organic electroluminescent light emitting element OEL may include a first electrode EL1, a hole transporting region HTR disposed on the first electrode EL1, a light emitting pattern EML disposed on the hole transporting region HTR, an electron transporting region ETR disposed on the light emitting pattern EML, and a second electrode EL2 disposed on the electron transporting region ETR. Here, the hole transporting region HTR may include a hole injection layer HIL and a hole transporting region HTR, and the electron transporting region ETR may include an electron injection layer EIL and an electron transporting region ETR. Layer OL may include the hole the transporting region HTR, the light emitting pattern EML, and the electron transporting region ETR as illustrated in FIG. 5.

The first electrode EL1 of the organic electroluminescent light emitting element OEL may have conductivity. The first electrode EL1 may be made of a metal alloy or a conductive compound. The first electrode EL1 may be an anode. The first electrode EL1 may be a pixel electrode.

The first electrode may be a reflective electrode in the organic electroluminescent light emitting element OEL according to an embodiment. However, an embodiment is not limited thereto. For example, the first electrode EL1 may be a transmissive electrode or a semi-transmissive electrode. When the first electrode EL1 is the semi-transmissive electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or mixture (for example, a mixture of Ag and Mg) thereof. Alternatively, the first electrode EL1 may have a multi-layered structure including a reflective or semi-transmissive layer, which may be made of the above-described materials, and a transparent conductive layer, which may be made of an indium tin oxide (ITO), an indium zinc oxide (IZO), a zinc oxide (ZnO), or an indium tin zinc oxide (ITZO). For example, the first electrode EL1 may be multiple metal layers or a have a structure in which metal layers of ITO/Ag/ITO may be laminated.

The hole transporting region HTR may have a single layer made of a single material, a single layer made of different materials, or a multi-layered structure including layers made of different materials. For example, the hole transporting region HTR may have structures including single layers made of different materials or a structure in which the first electrode EL1, the hole injection layer HIL/the hole transporting region HTR, the hole injection layer HIL/the hole transporting region HTR/a buffer layer (not shown), the hole injection layer HIL/the buffer layer (not shown), the hole transporting region HTR/the buffer layer (not shown), or the hole injection layer HIL/the hole transporting region HTR/ an electron stop layer (not shown) may be sequentially laminated from the first electrode EL1. However, an embodiment is not limited thereto.

For example, the hole transporting region HTR may include the hole injection layer HIL and the hole transporting region HTR, and a hole injection material and a hole transporting material may be used for the hole injection layer HIL and the hole transporting region HTR, respectively.

The hole transporting region HTR may be disposed on the first electrode EL1 in an opening defined in the pixel defining layer PDL and extend to an upper portion of the pixel defining layer PDL. However, an embodiment is not limited thereto. For example, the hole transporting region HTR may be patterned to be disposed in the opening.

The light emitting pattern EML may be disposed on the hole transporting region HTR. The light emitting pattern EML may have a single layer made of a single material, a single layer made of different materials, or a multi-layered structure including layers made of different materials.

However, an embodiment is not limited to the material of the light emitting pattern EML as long as the material is used within the spirit and the scope of the disclosure. For example, the light emitting pattern EML may be made of materials emitting red, green, and blue colors or contain a phosphor material and a fluorescent material. The light emitting pattern EML may include a host or a dopant. For example, referring to FIG. 5, the light emitting pattern EML may be disposed in the display opening D-OP defined in the pixel defining layer PDL. However, an embodiment is not limited thereto.

The electron transporting region ETR may be disposed on the light emitting pattern EML. Although the electron transporting region ETR may include at least one of the hole stop layer (not shown), the electron transporting region ETR, and the electron injection layer EIL, an embodiment is not limited thereto.

When the electron transporting region ETR includes the electron injection layer EIL and the electron transporting region ETR, an electron injection material and an electron transporting material may be used for the electron injection layer EIL and the electron transporting region ETR, respectively.

The second electrode EL2 may be disposed on the electron transporting region ETR. The second electrode EL2 may be a common electrode or a cathode. The second electrode EL2 may be made of a metal alloy or a conductive compound. The second electrode EL2 may be a transmissive electrode, a semi-transmissive electrode, or a reflective electrode. When the second electrode EL2 is the transmissive electrode, the second electrode EL2 may be made of a transparent metal oxide such as an indium tin oxide (ITO), an indium zinc oxide (IZO), a zinc oxide (ZnO), or an indium tin zinc oxide (ITZO).

When the second electrode EL2 is the semi-transmissive electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or mixture (for example, a mixture of Ag and Mg) thereof. Alternatively, the second electrode EL2 may have a multi-layered structure including a reflective or semi-transmissive layer, which may be made of the above-described materials, and a transparent conductive layer, which may be made of an indium tin oxide (ITO), an indium zinc oxide (IZO), a zinc oxide (ZnO), or an indium tin zinc oxide (ITZO).

According to an embodiment, as the remaining portion except for a portion that may generate light in an area overlapping the light emitting area is removed even when the second electrode EL2 includes the semi-transmissive electrode or the reflective electrode, an external light reflectance caused by external light may be minimized.

Figure 12:
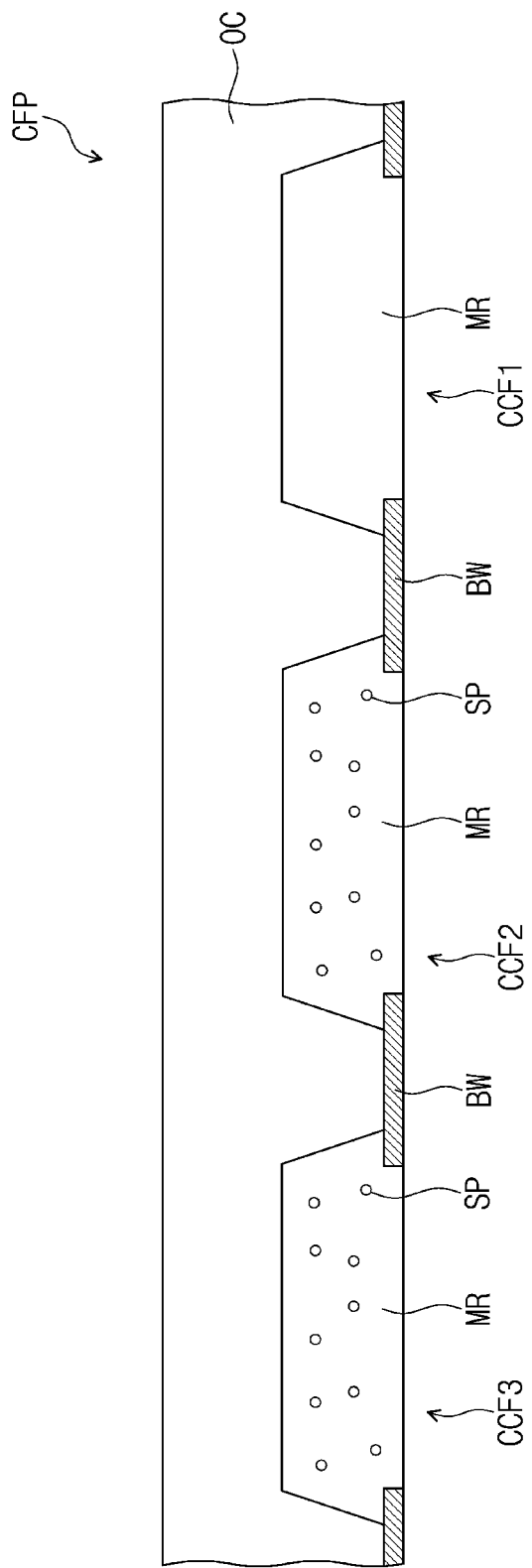
FIG. 12 is a schematic cross-sectional view illustrating a color filter member according to an embodiment.

FIG. 12 is a schematic cross-sectional view illustrating the color filter member according to an embodiment. The same or similar components as those in FIGS. 1A to 5 will be designated by the same or similar reference numerals, respectively, and repeated description thereof will be omitted.

FIG. 12 is a schematic cross-sectional view illustrating the color filter member CFP of the display device DS in FIG. 5. The color filter member CFP may include color filters CCF1, CCF2, and CCF3, and at least one of the color filters CCF1, CCF2, and CCF3 may include a scattering agent SP.

Referring to FIG. 12, in an embodiment, each of a second color filter CCF2 and a third color filter CCF3 may include the scattering agent SP, and the first color filter CCF1 may not include the scattering agent SP. Although not shown in the drawing, in an embodiment, the third color filter CCF3 may include the scattering agent SP, and each of the first color filter CCF1 and the second color filter CCF2 may not include the scattering agent SP.

The color filters CCF1, CCF2, and CCF3 may include a matrix portion MR made of a polymer photosensitive resin. The scattering agent SP may be dispersed in the matrix portion MR. The matrix portion MR may include a pigment or a dye in addition to the polymer photosensitive resin. In an embodiment, the matrix portion MR of each of the second color filter CCF2 and the third color filter CCF3 may include a pigment or a dye, and the first color filter CCF1 may include a polymer photosensitive resin without including a pigment or a dye. In an embodiment, the first color filter CCF1 may include the matrix portion MR containing a polymer photosensitive resin and a pigment or dye.

The scattering agent SP may include at least one of $TiO_2$, ZnO, $Al_2O_3$, $SiO_2$, hollow silica, and polystyrene particles. The scattering agent SP may include at least one of $TiO_2$, ZnO, $Al_2O_3$, $SiO_2$, hollow silica, and polystyrene particles or a mixture of at least two selected from the group consisting of $TiO_2$, ZnO, $Al_2O_3$, $SiO_2$, hollow silica, and polystyrene particles made of polystyrene resin. For example, the color filter member CFP according to an embodiment may include $TiO_2$ as the scattering agent SP. The scattering agent SP may be globular particles. However, an embodiment is not limited thereto. For example, the scattering agent SP may have an oval sphere shape or an amorphous shape.

According to an embodiment, as the remaining portion except for the necessary portion that may generate light of the electrode contained in the organic electroluminescent light emitting element is removed, the defect, in which the electrode is reflected by light incident to the light emitting areas and seen to the user, may be minimized. Thus, the display device having improved visibility may be provided.

Although embodiments have been described, it is understood that the disclosure should not be limited to these embodiments but various changes and modifications can be made by one of ordinary skill in the art within the spirit and scope of the disclosure as hereinafter claimed.

Hence, the scope of the disclosure shall be determined by the accompanying claims.

What is claimed is:

1. A display device comprising:
    a base layer;
    a first electrode disposed on the base layer;
    a pixel defining layer disposed on the base layer, the pixel defining layer including a display opening that exposes the first electrode;
    a light emitting pattern disposed on the first electrode;
    a second electrode disposed on the light emitting pattern, the second electrode including an electrode opening that passes completely though the second electrode;
    a division pattern disposed on the second electrode, the division pattern including a division opening overlapping the display opening; and
    a color filter disposed in the division opening, wherein
    the electrode opening overlaps the division opening and is spaced apart from the display opening, and
    a portion of the second electrode overlaps the division pattern.

2. The display device of claim 1, wherein the second electrode comprises:
    a first portion overlapping the light emitting pattern;
    a second portion overlapping the division pattern; and
    a third portion extending from the first portion to the second portion.

3. The display device of claim 2, wherein the first portion has an area greater than an area of the third portion.

4. The display device of claim 2, wherein the third portion is disposed in plurality in an area overlapping the division opening.

5. The display device of claim 4, wherein the electrode opening is disposed in plurality in an area overlapping the division opening.

6. The display device of claim 1, further comprising at least one of:
    a hole transporting region disposed between the first electrode and the light emitting pattern; and
    an electron transporting region disposed between the light emitting pattern and the second electrode.

7. The display device of claim 6, wherein the electrode opening of the second electrode exposes a portion of one of the hole transporting region, the electron transporting region, and the pixel defining layer in an area overlapping the division opening.

8. The display device of claim 1, wherein the division opening has an area greater than an area of the display opening.

9. The display device of claim 1, wherein the pixel defining layer is a black pixel defining layer.

10. The display device of claim 1, further comprising:
    an encapsulation member disposed between the pixel defining layer and the color filter and overlapping the second electrode.

11. The display device of claim 10, further comprising:
    a detection sensor disposed between the encapsulation member and the color filter.

12. The display device of claim 1, wherein the color filter comprises at least one of a red pigment or dye, a green pigment or dye, or a polymer photosensitive resin.

13. The display device of claim 1, wherein
    the light emitting pattern is disposed in plurality, and
    the plurality of light emitting patterns have different areas from each other.

14. A display device comprising:
    a base layer;
    a first electrode disposed on the base layer;
    a pixel defining layer disposed on the base layer, the pixel defining layer including a display opening that exposes the first electrode;
    a light emitting pattern disposed on the first electrode;
    a second electrode disposed on the light emitting pattern;
    a division pattern disposed on the second electrode, the division pattern including a division opening overlapping the display opening; and
    a color filter disposed in the division opening,
    wherein the second electrode comprises:
        a first portion overlapping the light emitting pattern;
        a second portion overlapping the division pattern; and
        a third portion extending from the first portion to the second portion, wherein
        the second portion is spaced apart from the first portion with the third portion therebetween and the second portion surrounds at least a portion of the first portion.

15. The display device of claim 14, wherein
    an electrode opening, which overlaps the division opening and is spaced apart from the display opening, is defined in the second electrode, and
    the electrode opening passes completely though the second electrode.

16. The display device of claim 14, wherein the third portion is disposed in plurality in an area overlapping the division opening.

17. The display device of claim 16, wherein the second electrode includes a plurality of electrode openings.

18. The display device of claim 14, wherein the first portion has an area greater than an area of the third portion.

19. The display device of claim 14, wherein the third portion is disposed in plurality in an area overlapping the division opening.

20. The display device of claim 14, further comprising at least one of:
    a hole transporting region disposed between the first electrode and the light emitting pattern; and
    an electron transporting region disposed between the light emitting pattern and the second electrode.

21. The display device of claim 20, wherein the electrode opening of the second electrode exposes a portion of one of the hole transporting region, the electron transporting region, and the pixel defining layer in an area overlapping the division opening.

22. The display device of claim 14, wherein the division opening has an area greater than an area of the display opening.

23. The display device of claim 14, wherein the pixel defining layer is a black pixel defining layer.

24. The display device of claim 14, wherein the color filter comprises at least one of a red pigment or dye, a green pigment or dye, or a polymer photosensitive resin.

\* \* \* \* \*